(12) United States Patent
Lin

(10) Patent No.: US 6,795,344 B2
(45) Date of Patent: Sep. 21, 2004

(54) FLOATING GATE MEMORY ARCHITECTURE WITH PROGRAM VOLTAGE STABLE CIRCUIT

(75) Inventor: Yeh Jun Lin, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/316,851

(22) Filed: Dec. 12, 2002

(65) Prior Publication Data

US 2003/0235086 A1 Dec. 25, 2003

(30) Foreign Application Priority Data

Jun. 19, 2002 (TW) ........................................ 91113409 A

(51) Int. Cl.⁷ .............................................. G11C 16/10
(52) U.S. Cl. .............................. 365/185.2; 365/185.03; 365/185.12; 365/185.18; 365/185.23; 365/185.33; 327/537; 327/538; 327/540; 327/541
(58) Field of Search ...................... 365/185.03, 185.02, 365/185.12, 185.11, 185.2, 185.18, 185.23, 185.33; 327/537, 535, 538, 540, 541

(56) References Cited

U.S. PATENT DOCUMENTS

| | | | | |
|---|---|---|---|---|
| 5,029,130 A | * | 7/1991 | Yeh ........................ | 365/185.31 |
| 6,175,521 B1 | * | 1/2001 | Pascucci et al. ........ | 365/185.18 |
| 6,178,118 B1 | * | 1/2001 | Lin et al. ................ | 365/185.28 |
| 6,535,425 B2 | * | 3/2003 | Nawaki et al. ......... | 365/185.18 |
| 6,603,681 B2 | * | 8/2003 | Micheloni et al. ..... | 365/185.19 |

* cited by examiner

Primary Examiner—Andrew Q. Tran
(74) Attorney, Agent, or Firm—Bacon & Thomas, PLLC

(57) ABSTRACT

A floating gate memory architecture having current regulator is disclosed. A floating gate memory block have at least a programming voltage node for being programmed a plurality of bits according to the control of a plurality of bit lines. A high voltage source provides a regulated voltage when the plurality of bits are programmed in. A high voltage decoder locates between the floating gate memory block and the high voltage source for connecting the voltage to the programming voltage node according to the programming data of the floating gate memory block. A current regulator connects to the programming voltage node for keeping the programming voltage node in a constant voltage, and making a constant current flowing into said floating gate memory block according to said plurality of bits.

5 Claims, 6 Drawing Sheets

FLOATING GATE MEMORY ARCHITECTURE WITH PROGRAM VOLTAGE STABLE CIRCUIT

FIELD OF THE INVENTION

The present invention is related to a floating gate memory architecture, and more particularly to a floating gate memory architecture having a current regulator. There are a novel method and circuit to resolve the variation of the regulated voltage to be constant during programming with different programming currents due to the variation of program data.

BACKGROUND OF THE INVENTION

Floating gate memory devices, which are programmed by using hot electron injection and erased by using Fowler Nordheim tunneling, are well-known and described in detail in U.S. Pat. No. 5,029,130.

Please refer to FIG. 1. When data are written into the memory block 11, the high voltage that generated by HV source (22) is a regulated and precision voltage for a certain range of program current being consumed. However, in order to pass this regulated voltage to the expected source line (36a2), this high voltage has to pass through the HV decoder (60a) (FIG. 2) to reach the designated source line (36a2). Due to the tight pitch of the memory cell, the transistors (62b) in HV decoder (60a) that have to pass through this regulated high voltage cannot be made as large as we wanted. So that when we program data with "all 0", the worst program current case (Idp (program current per bit)×8 (For byte programming)) there will be voltage drop between the node V1 and V2 due to the size issue of the transistor in the HV decoder (60a). If the program data is "all one" of the best program current case (no Idp at all), V1 will be almost equal to V2. This will cause a problem that the source line voltage (V2) during programming will depend on the data being programmed and this problem will made a large variation in programming voltage in source line especially when the program current is large (Ex. program "all 0" in Multi-byte programming operation.)

This situation will come worse when technology goes down to smaller geometry of which can tolerate less margin for program bias variation. The memory cell needs a constant and precise high voltage on the source line for programming otherwise either program disturb or poor programming efficiency will occur.

SUMMARY OF THE INVENTION

An object of the present invention is to provide a current regulator for stabilizing V2 in a constant voltage by absorbing the extra current of node V2 according to the different programming data. Therefore the reliability and life cycle of the memory cell will be promoted, and the memory cell design will not be affected when the technology is advanced.

According to the present invention, a floating gate memory architecture having current regulator comprises:

A floating gate memory block having at least a programming voltage node for being programmed a plurality of bits (data) according to the control of a plurality of bit lines;

A high voltage source providing a regulated voltage when the plurality of bits (data) are programmed in;

A high voltage decoder locating between the floating gate memory block and the high voltage source for connecting the voltage to the programming voltage node according to the programming data of the floating gate memory block; and A current regulator connecting to the programming voltage node, for keeping the programming voltage node in a constant voltage, and making a constant current flowing into said floating gate memory block according to said plurality of bits (data).

In accordance with one aspect of the present invention, the floating gate memory block is a flash memory block. The voltage is provided by the high voltage source when the plurality of bits are programmed into the flash memory block.

In accordance with one aspect of the present invention, the plurality of bits (data) include eight bits.

In accordance with one aspect of the present invention, the high voltage decoder includes several transistors.

In accordance with one aspect of the present invention, the current regulator includes a current adder and a current mirror. The current adder generates a reference program current according to the plurality of bits (data), and the reference program current makes the current mirror absorb an extra current from the programming voltage node. So, the programming voltage node has a constant voltage.

According to the present invention, a current regulator generates a relative load by a plurality of bits (data), and then makes the programming voltage node have a constant voltage. The current regulator comprises:

A current adder for generating the relative load by the plurality of bits (data), and generating a reference program current according to the relative load; and A current mirror connecting to the current adder for absorbing an extra current from the programming voltage node according to the reference program current, and making the programming voltage node have a constant voltage.

In accordance with one aspect of the present invention, the plurality of bits (data) have eight bits.

In accordance with one aspect of the present invention, the current adder includes a control current source and eight current mapping circuits. These current mapping circuits are parallel and controlled ON/OFF by the eight bits (data).

In accordance with one aspect of the present invention, a current generated by a current mapping circuit is equal to the control current source.

In accordance with one aspect of the present invention, the eight current mapping circuits generate eight currents to form the reference program current.

In accordance with one aspect of the present invention, the control current source is controlled by a bias voltage signal.

In accordance with one aspect of the present invention, the current adder is controlled by an input signal (PROG) (program).

The present invention may best be understood through the following description with reference to the accompanying drawings, in which:

DETAILED DESCRIPTION OF THE PREFERRED EMBODIMENT

Figure 1:
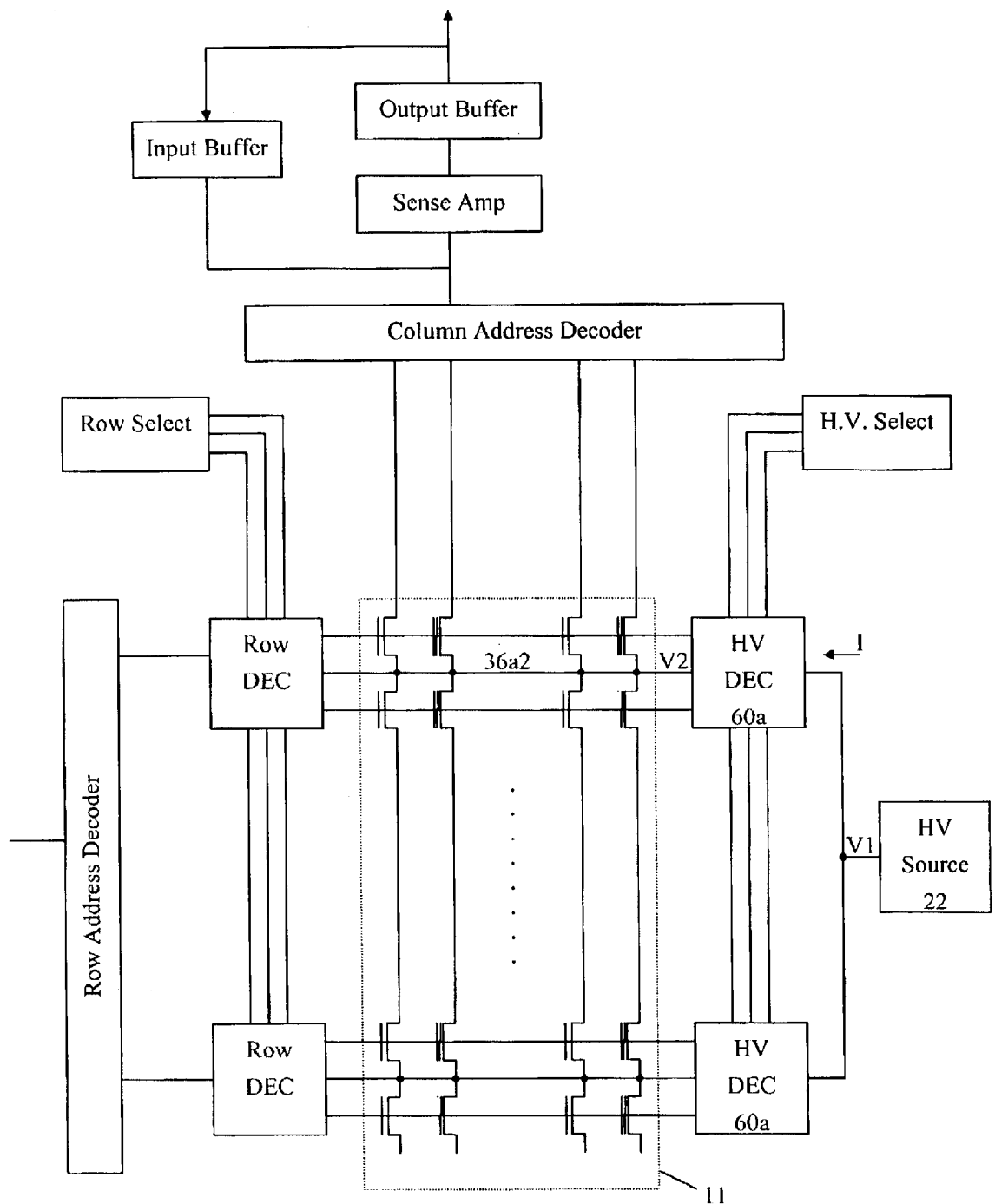
FIG. 1 is a conventional floating gate memory architecture.
Figure 2:
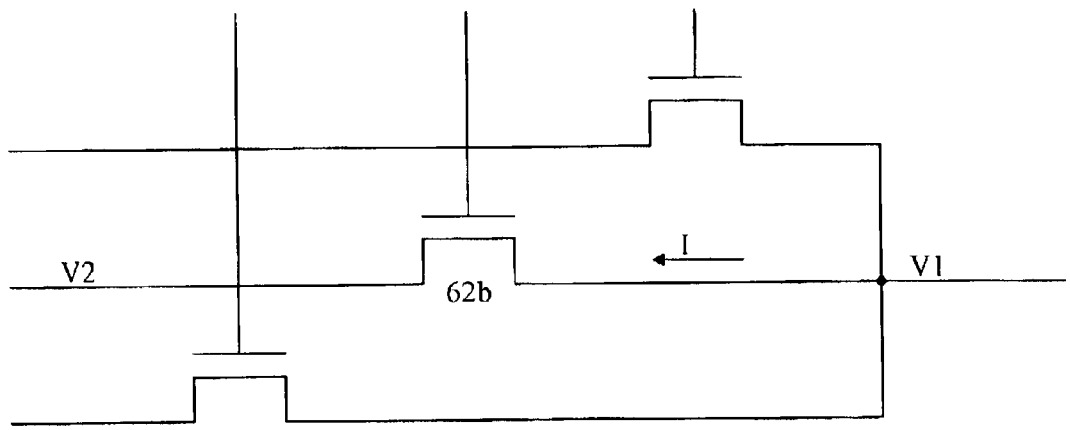
FIG. 2 is a conventional high voltage decoder (HV DEC) circuit.
Figure 3:
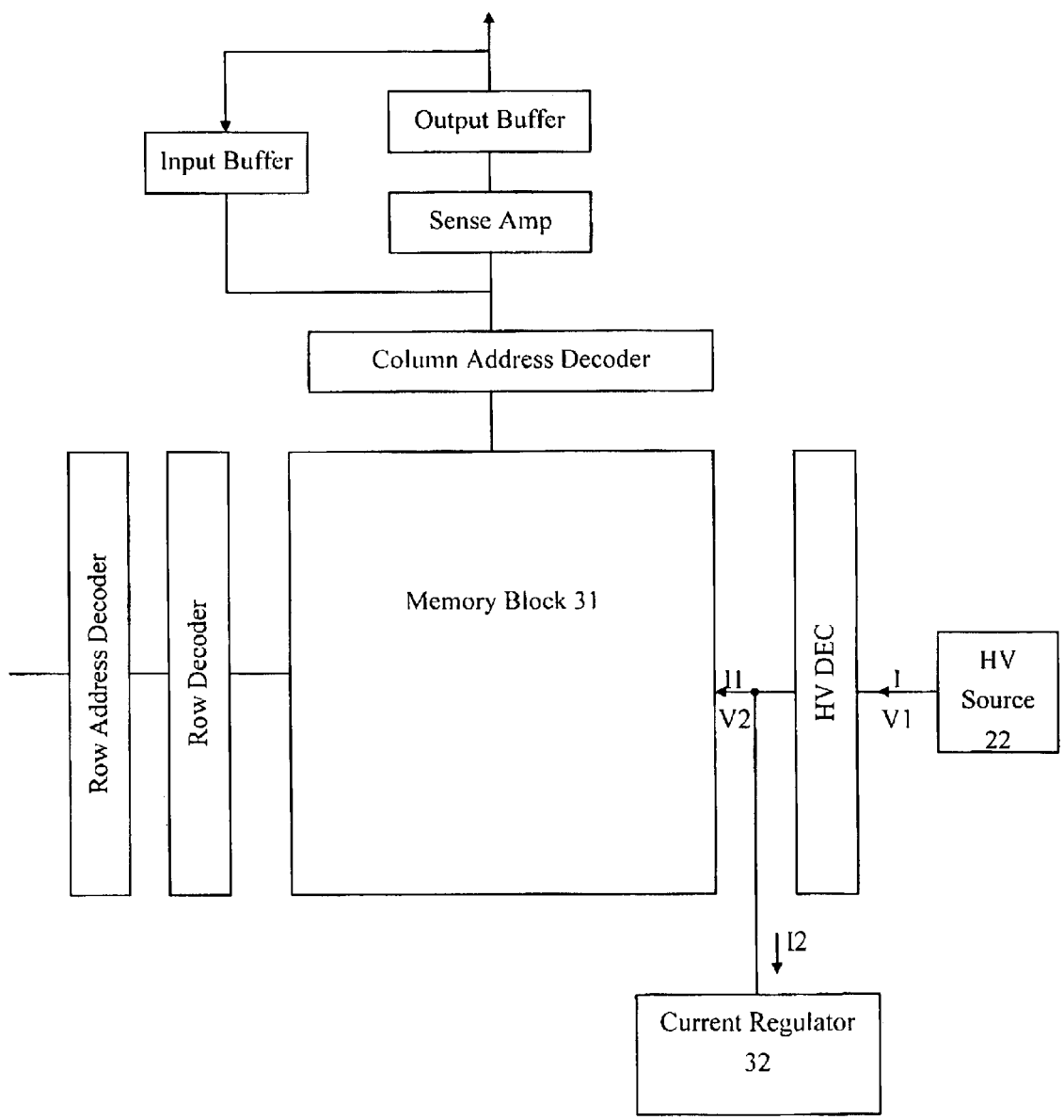
FIG. 3 is a block diagram 1 of the floating gate memory architecture according to the present invention.

In order to eliminate the problem that described in above, a preferred embodiment (FIG. 3) is designed. FIG. 3 shows the floating gate memory architecture according to the present invention. There are a floating gate memory block 31, a high voltage source 22 (HV Source), a high voltage decoder (HV DEC), and a current regulator 32. The programming voltage node V2 applies a constant voltage to the common source line for programming the plurality of bits (data) into the memory block 31. The current regulator 32 will absorb current 12 to keep current 11 and voltage V2 in a constant value according to the contents of the plurality of bits (data) to program.

Figure 4A:
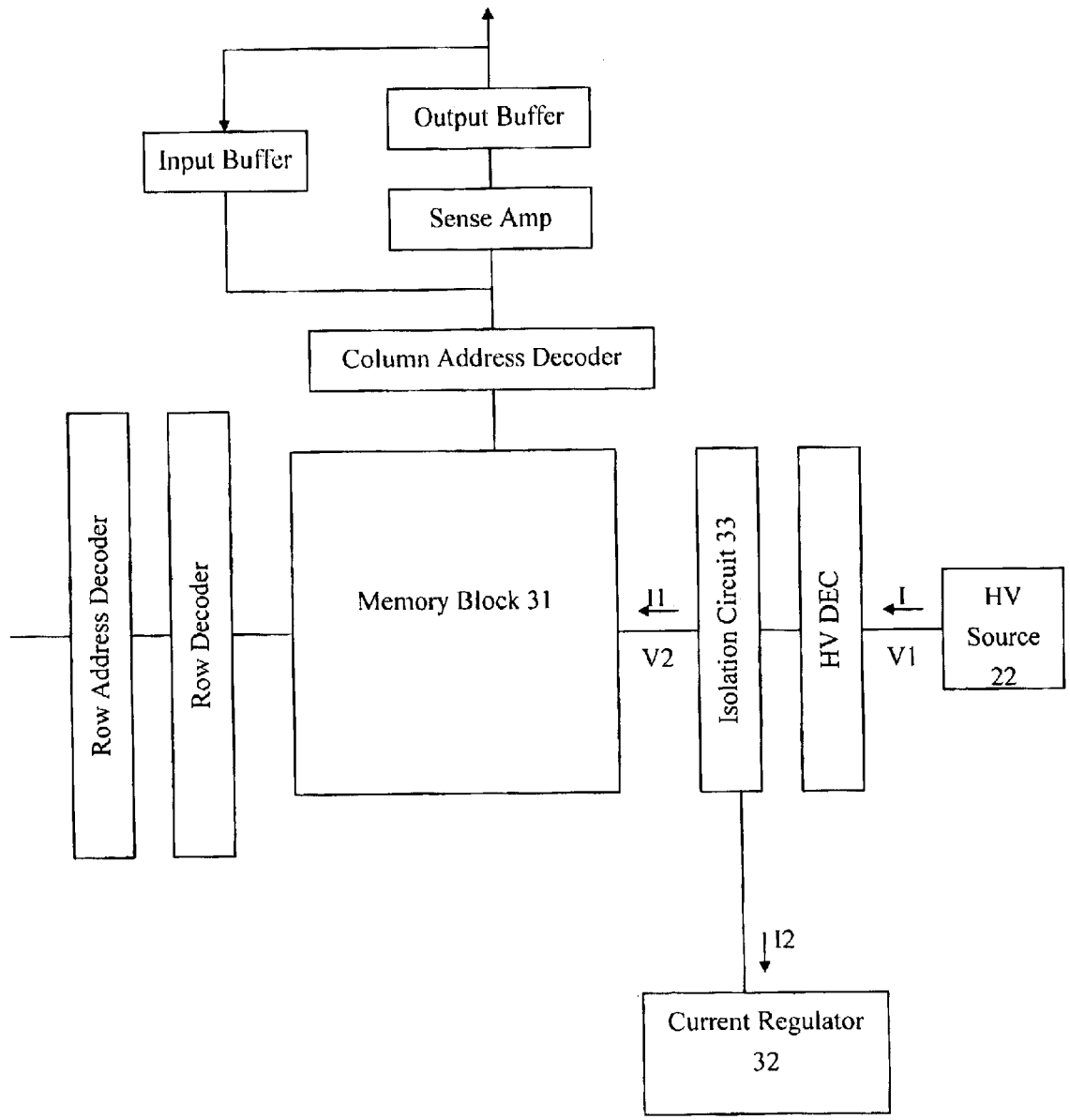
FIG. 4(a) is a block diagram 2 of the floating gate memory architecture according to the present invention.
Figure 4:
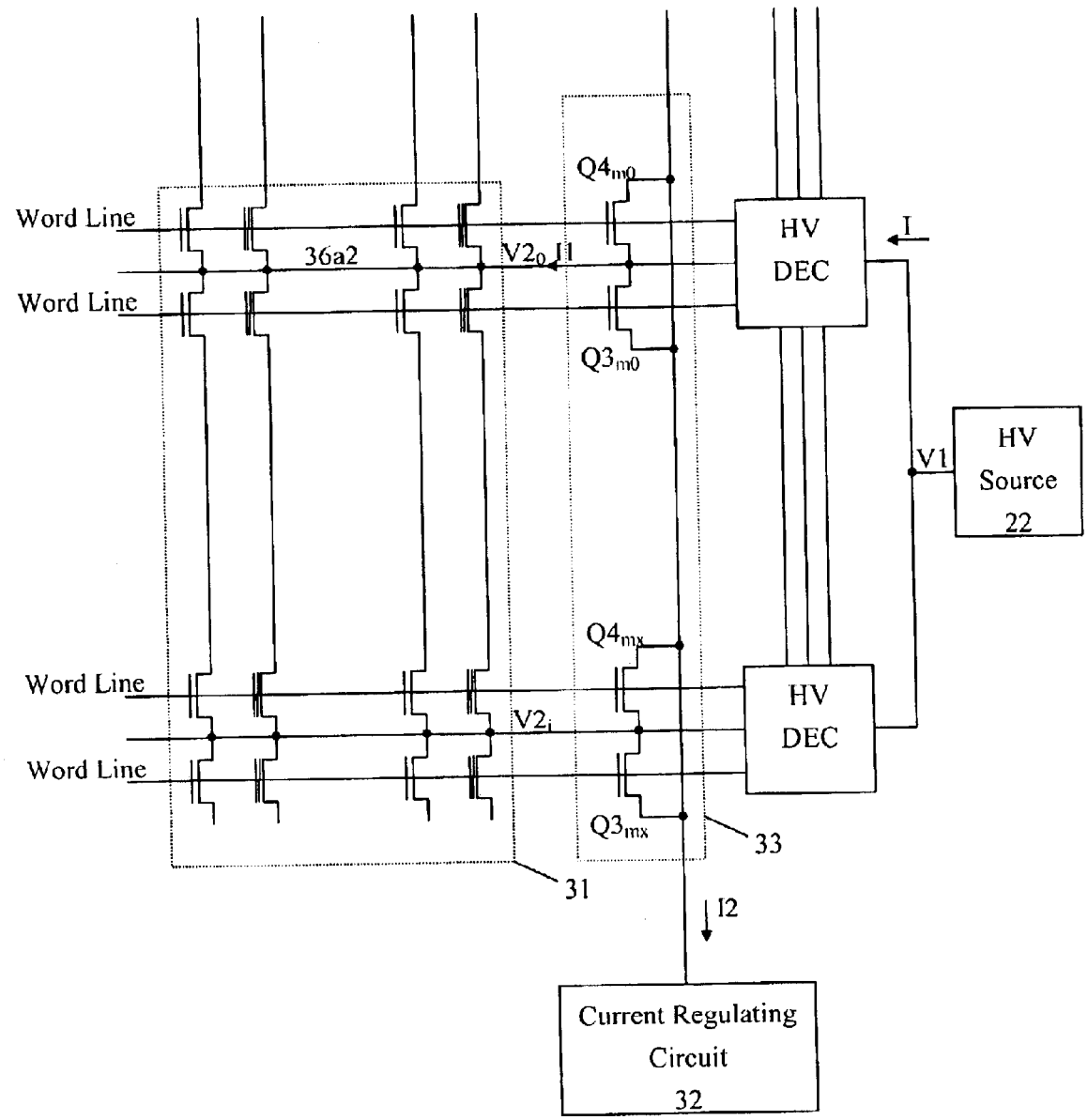
FIG. 4(b) is a floating gate memory circuit according to the present invention.

Another preferred embodiment (FIG. 4(a)) is designed with an isolation circuit 33 having a plurality of isolation transistors $Q3_{m0}, Q4_{m0}, \ldots, Q3_{mx}, Q4_{mx}$ (FIG. 4(b)). These isolation transistors are connected to the current regulator 32 for absorbing the extra current 12.

The gate of each isolation transistors (FIG. 4(b)) is connected to the each word-line and the source is connected to source line while the drains of all the transistors are all connected to the current regulator 32.

The size of the isolation transistor is determined by the worst case of program current that it has to flow through to the current regulator 32.

The basis principle of this invention is to create an addition extra current 12 in the source line and this extra current 12 will keep track with the magnitude and the data being programmed. So that the total current 11 that flows through the pass transistors of the HV decoder (HV DEC) will be constant (Not program data dependant), hence the source voltage V2 during programming will be constant.

The function of the isolation circuit 33 is to provide a path which is large enough for the current to pass through them to the current regulator and since their gates are connected to the word-line, so that no more decoding scheme is required and hence we can only use one set of current regulator to achieve this purpose, otherwise, either use another decoding control to these isolation transistors or each source line with a current regulator 32. So that this scheme is the most economic way to save chip area and achieve this goal.

The current regulator is formed by a current source that is connected to the isolation transistors. The magnitude of this current source is controlled by the data being programmed. For example, if the data being programmed is "05Hex", that means there will be six bits' program current being drawn by the memory cells themselves, in order to make a constant current to flow through the pass transistor in the HV decoder, this proposed current regulator has to provide an extra current which is equal to two bits of program current. So that there will always have maximum and constant current flows through the HV decoder and hence keep the source line voltage being program constant no matter of data being programmed.

Figure 5:
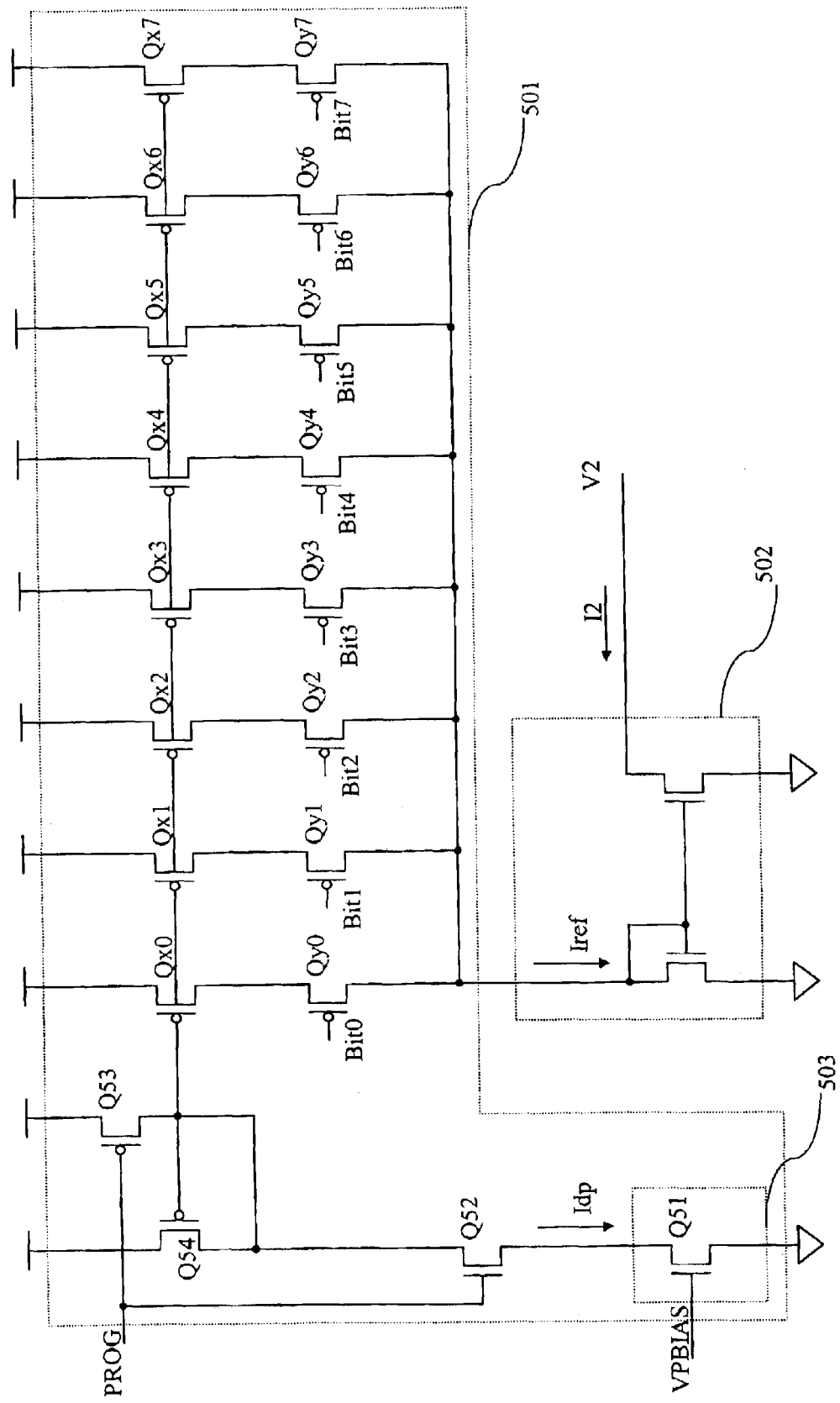
FIG. 5 is a current regulator according to the present invention.

FIG. 5 is one of the preferred embodiments of the current regulator for data width of eight bits. The signal PROG is enabled to activate this circuit during programming period only and the NMOS Q51 forms a reference program current source Idp equal to the current for 1 bit of the current being required during programming with a suitable bias control of the signal VPBIAS (program bias voltage). This reference program current will be coupled to a current mirror formed by PMOS of Q54, Qx0, Qx1, Qx2, Qx3, Qx4, Qx5, Qx6, Qx7. The signals Bit0, . . . , Bit7 control the on or off of eight current mirrors path (Qx0, Qx1, Qx2, Qx3, Qx4, Qx5, Qx6, Qx7) to the programming voltage node V2.

For the example above to program data="05 Hex." Means <Bit0, . . . , Bit7>=<0000,0101> (Binary). So that during programming, the current mirror path form Qy0 and Qy2 will have reference program current Iref and the total of two reference program current will be coupled to form the extra current 12 (from V2).

In other words, the current regulator includes a current adder 501 and a current mirror 502. The current adder includes a control current source 503. The extra current 12 is determined by the programming bits (data) (Bit0, . . . , Bit7). Therefore, the programming voltage node V2 will keep in a constant voltage when the memory block 31 is programmed. There are eight current mapping circuits in the current regulator. Transistor Qx0 and Qy0 make a first current mapping circuit. And, transistor Qx7 and Qy7 is an eighth current mapping circuit.

The advantages of the present invention are as follows:
1. The current regulator can stabilize V2 in a constant voltage by absorbing the extra current 12 of node V2 according to the different programming data.
2. The reliability and life cycle of the memory cell will be promoted, and the memory cell design will not be affected when the technology is advanced.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A floating gate memory architecture having current regulator comprising:
a floating gate memory block having at least a programming voltage node for being programmed a plurality of bits according to a control of a plurality of bit lines;
a high voltage source providing a regulated voltage when said plurality of bits being programmed in;
a high voltage decoder locating between said floating gate memory block and said high voltage source for connecting said voltage to said programming voltage node according to said programming data of said floating gate memory block; and
a current regulator connecting to said programming voltage node for keeping said programming voltage node in a constant voltage, and making a constant current flowing into said floating gate memory block according to said plurality of bits being programmed.

2. A floating gate memory architecture according to claim 1 wherein said floating gate memory block is a flash memory block, and said voltage is provided by said high voltage source when said plurality of bits are programmed into said flash memory block.

3. A floating gate memory architecture according to claim 1 wherein said plurality of bits includes eight bits.

4. A floating gate memory architecture according to claim 1 wherein said high voltage decoder includes several transistors.

5. A floating gate memory architecture according to claim 1 wherein said current regulator includes a current adder and a current mirror, said current adder generates a reference program current according to said plurality of bits, said reference program current makes said current mirror absorb an extra current from said programming voltage node, and said programming voltage node has said constant voltage.

* * * * *